United States Patent
Kobayashi et al.

(10) Patent No.: US 10,063,762 B2
(45) Date of Patent: Aug. 28, 2018

(54) IMAGE SENSOR AND DRIVING METHOD THEREOF, AND IMAGE CAPTURING APPARATUS WITH OUTPUT SIGNAL CONTROL ACCORDING TO COLOR

(71) Applicant: CANON KABUSHIKI KAISHA, Tokyo (JP)

(72) Inventors: Hirokazu Kobayashi, Tokyo (JP); Takafumi Kishi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 51 days.

(21) Appl. No.: 15/202,790

(22) Filed: Jul. 6, 2016

(65) Prior Publication Data
US 2017/0019583 A1     Jan. 19, 2017

(30) Foreign Application Priority Data
Jul. 13, 2015   (JP) .................................. 2015-140058

(51) Int. Cl.
| | |
|---|---|
| H04N 5/335 | (2011.01) |
| H04N 5/232 | (2006.01) |
| H01L 27/146 | (2006.01) |
| H04N 5/374 | (2011.01) |
| H04N 5/3745 | (2011.01) |
| H04N 5/378 | (2011.01) |

(Continued)

(52) U.S. Cl.
CPC ... *H04N 5/23212* (2013.01); *H01L 27/14621* (2013.01); *H01L 27/14641* (2013.01); *H01L 27/14645* (2013.01); *H04N 5/374* (2013.01); *H04N 5/378* (2013.01); *H04N 5/3745* (2013.01); *H04N 9/045* (2013.01); *G02B 5/201* (2013.01)

(58) Field of Classification Search
CPC .................................................. H04N 5/23212
USPC ......................................................... 348/302
See application file for complete search history.

(56) References Cited

U.S. PATENT DOCUMENTS

| 8,970,757 B2 | 3/2015 | Kobayashi | |
| 2011/0080493 A1* | 4/2011 | Kono | ................ H01L 27/14609 348/222.1 |

(Continued)

FOREIGN PATENT DOCUMENTS

| JP | 2001-083407 A | 3/2001 |
| JP | 2014-072541 A | 4/2014 |

*Primary Examiner* — Usman Khan
(74) *Attorney, Agent, or Firm* — Fitzpatrick, Cella, Harper & Scinto

(57) ABSTRACT

An image sensor comprising: a plurality of unit pixels, arranged in matrix, each having a plurality of photoelectric conversion portions for accumulating charge corresponding to a quantity of incident light; color filters, arranged for the plurality of unit pixels, respectively, that mainly pass light of wavelengths corresponding to different colors; first control signal lines arranged between every predetermined number of rows and connected to the unit pixels, included in the predetermined number of rows, corresponding to the color filters of a first color; and second control signal lines arranged between the every predetermined number of rows and connected to the unit pixels, included in the same predetermined number of rows that include the unit pixels corresponding to the color filters of the first color, corresponding to the color filters of a second color.

10 Claims, 8 Drawing Sheets

(51) Int. Cl.
    *H04N 9/04*     (2006.01)
    *G02B 5/20*     (2006.01)

(56)         References Cited

U.S. PATENT DOCUMENTS

2013/0033632  A1   2/2013  Kishi
2015/0256778  A1   9/2015  Kusaka

* cited by examiner

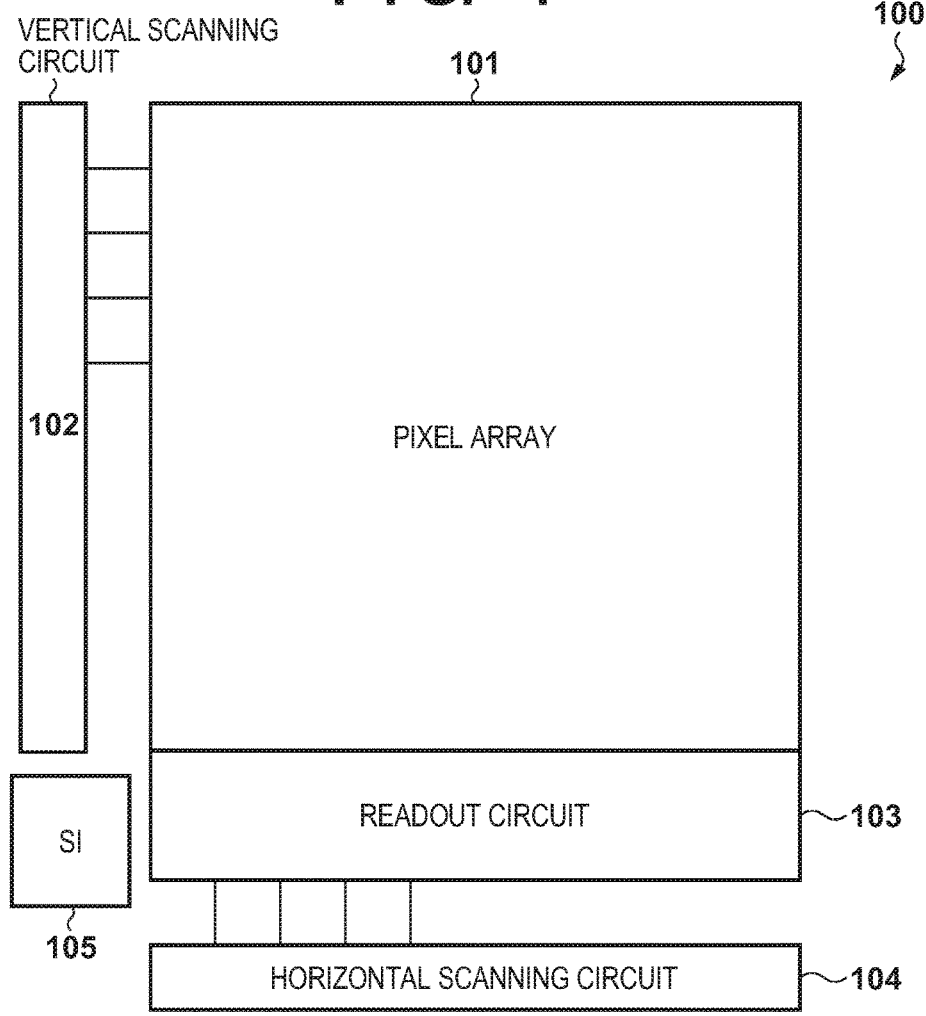
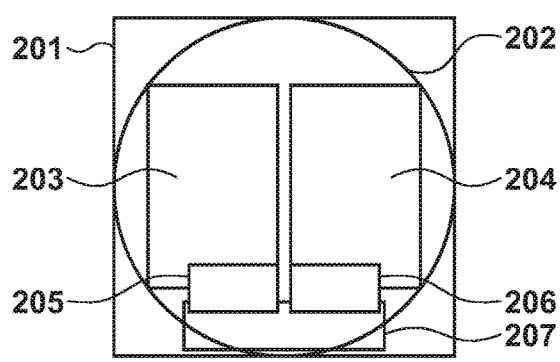

IMAGE SENSOR AND DRIVING METHOD THEREOF, AND IMAGE CAPTURING APPARATUS WITH OUTPUT SIGNAL CONTROL ACCORDING TO COLOR

BACKGROUND OF THE INVENTION

Field of the Invention

The present invention relates to an image sensor and driving method thereof, and an image capturing apparatus and, more specifically, to an image sensor having pixels capable of receiving light that has transmitted through divided pupil regions of an imaging lens, and driving method thereof, and an image capturing apparatus including the image sensor.

Description of the Related Art

Conventionally, there is a technique for performing image shooting and phase difference focus detection using a structure in which each of pixels that constitute an image sensor receives bundles of light that have transmitted though different pupil regions of an imaging lens. Japanese Patent Laid-Open No. 2001-083407 discloses a structure in which two photodiodes (PD) are provided for each microlens of each pixel so that respective PDs receive bundles of light that have transmitted through different pupil regions of an imaging lens. Then, using signals output from the respective PDs, detection of an image offset amount, namely, phase difference detection, is performed, and a defocus amount is calculated from the image offset amount, thereby performing focus detection. Further, by adding signals of the respective PDs, that have received bundles of light passing through the different pupil regions of an image lens, for each pixel, it is possible to generate an image signal for viewing.

In an image sensor having two PDs for each microlens, in order to read out signals from two PDs independently, it takes twice as long as time required for reading out a signal from a pixel having one PD, if the readout is performed in the same manner. Accordingly, there is suggested a technique for shortening a readout time by reducing the number of signals used for the phase difference detection in consideration of color arrangement of a color filter that covers each pixel of the image sensor. Japanese Patent Laid-Open No. 2014-072541 discloses an image sensor in which pixels for obtaining an image (imaging pixel) and pixels for focus detection (focus detection pixels) are alternately arranged in a checker pattern. More specifically, the image sensor is covered with a Bayer color filter, wherein red filters and blue filters cover the imaging pixels, and green filters cover the focus detection pixels. Since the green filters have spectral transmission characteristics in the middle of spectral transmission characteristics of red and blue filters, this arrangement is considered preferable.

However, it is not guaranteed that colors of a subject include a large amount of green color component, and moreover, color component distribution suitable for focus detection differs between light sources that illuminate the subject. Furthermore, even if a subject includes a large amount of green color component, there is no guarantee that a high frequency component that is suitable for focus detection resides in green color. Thus, it is not always possible to read out focus detection pixels suitable for conditions of the subject when the technique disclosed in Japanese Patent Laid-Open No. 2014-072541 is used.

SUMMARY OF THE INVENTION

The present invention has been made in consideration of the above situation, and increases focus detection accuracy and reduces a time for reading out signals from an image sensor.

According to the present invention, provided is an image sensor comprising: a plurality of unit pixels, arranged in matrix, each having a plurality of photoelectric conversion portions for accumulating charge corresponding to a quantity of incident light; color filters, arranged for the plurality of unit pixels, respectively, that mainly pass light of wavelengths corresponding to different colors; first control signal lines arranged between every predetermined number of rows and connected to the unit pixels corresponding to the color filters of a first color, the unit pixels being included in the predetermined number of rows; and second control signal lines arranged between the every predetermined number of rows and connected to the unit pixels corresponding to the color filters of a second color, the unit pixels being included in the same predetermined number of rows that include the unit pixels corresponding to the color filters of the first color.

Further, according to the present invention, provided is an image capturing apparatus, comprising: an image sensor having: a plurality of unit pixels, arranged in matrix, each having a plurality of photoelectric conversion portions for accumulating charge corresponding to a quantity of incident light; color filters, arranged for the plurality of unit pixels, respectively, that mainly pass light of wavelengths corresponding to different colors; first control signal lines arranged between every predetermined number of rows and connected to the unit pixels corresponding to the color filters of a first color, the unit pixels being included in the predetermined number of rows; and second control signal lines arranged between the every predetermined number of rows and connected to the unit pixels corresponding to the color filters of a second color, the unit pixels being included in the same predetermined number of rows that include the unit pixels corresponding to the color filters of the first color; and a control unit configured to control to drive one of the first control signal lines and the second control signal lines by a divided readout method and drive the other of the first control signal lines and the second control signal lines by an added readout method on a basis of a result of analyzing image signals obtained from the image sensor, wherein, the divided readout method is capable of obtaining a pair of signals having parallax and an added signal from the charge accumulated in the plurality of photoelectric conversion portions of each unit pixel, and the added readout method is to obtain an added signal without obtaining a pair of signals having parallax from the charge accumulated in the plurality of photoelectric conversion portions of each unit pixel.

Furthermore, according to the present invention, provided is a driving method for an image sensor that has a plurality of unit pixels, arranged in matrix, each having a plurality of photoelectric conversion portions for accumulating charge corresponding to a quantity of incident light, color filters, arranged for the plurality of unit pixels, respectively, that mainly pass light of wavelengths corresponding to different colors, first control signal lines arranged between every predetermined number of rows and connected to the unit pixels corresponding to the color filters of a first color, the unit pixels being included in the predetermined number of rows, and second control signal lines arranged between the every predetermined number of rows and connected to the unit pixels corresponding to the color filters of a second color, the unit pixels being included in the same predetermined number of rows that include the unit pixels corresponding to the color filters of the first color, wherein the method comprising: determining to drive one of the first control signal lines and the second control signal lines by a divided readout method and drive the other of the first control signal lines and the second control signal lines by an added readout method on a basis of a result of analyzing image signals obtained from the image sensor, wherein, the divided readout method is capable of obtaining a pair of signals having parallax and an added signal from the charge accumulated in the plurality of photoelectric conversion portions of each unit pixel, and the added readout method is to obtain an added signal without obtaining a pair of signals having parallax from the charge accumulated in the plurality of photoelectric conversion portions of each unit pixel; driving, based on a determination result, one of the first control signal lines and the second control signal lines by the divided readout method and reading out signals from the unit pixels connected to the control signal lines driven by the divided readout method, and driving the other of the first control signal lines and the second control signal lines by the added readout method and reading out signals from the unit pixels connected to the control signal lines driven by the added readout method.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

FIG. 1 is a diagram illustrating a simplified configuration of an image sensor according to an embodiment of the present invention;

FIG. 2 is a diagram illustrating a brief configuration of a pixel according to the embodiment;

DESCRIPTION OF THE EMBODIMENTS

Figure 3:
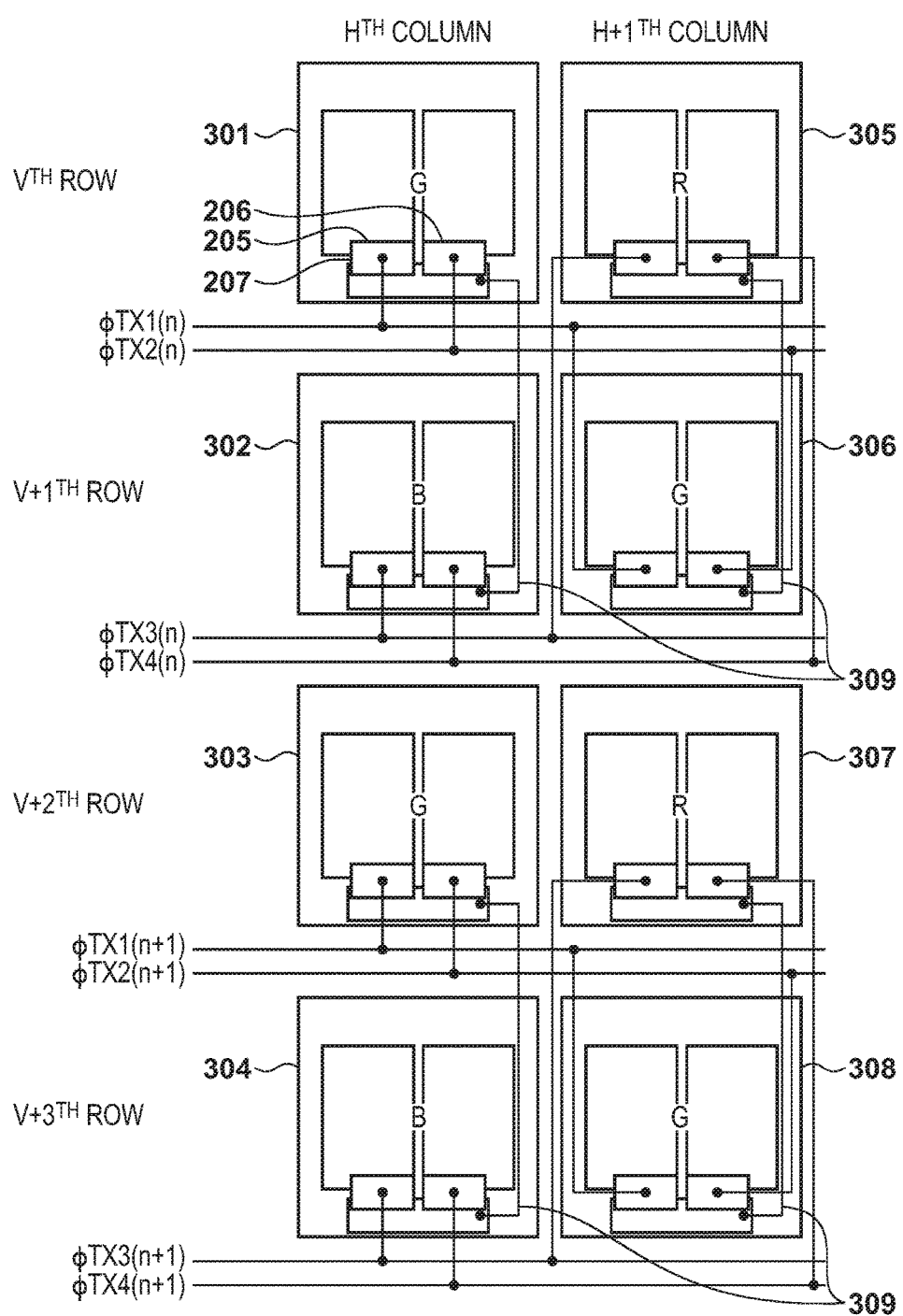
FIG. 3 is a diagram illustrating an example of part of pixels and wiring layout according to the embodiment.

Exemplary embodiments of the present invention will be described in detail in accordance with the accompanying drawings. The dimensions, shapes and relative positions of the constituent parts shown in the embodiments should be changed as convenient depending on various conditions and on the structure of the apparatus adapted to the invention, and the invention is not limited to the embodiments described herein.

FIG. 1 is a diagram illustrating a brief configuration of an image sensor according to an embodiment. In FIG. 1, an image sensor 100 includes a pixel array 101 including a plurality of unit pixels arranged in matrix, a vertical scanning circuit 102 for selecting a pixel row in the pixel array 101, a horizontal scanning circuit 104 for selecting a pixel column in the pixel array 101, a readout circuit 103 for reading out signals from unit pixels of a row selected by the vertical scanning circuit 102 among the plurality of unit pixels included in the pixel array 101, and a serial interface (SI) 105 used for instructing an operation mode and the like of each circuit from outside. The readout circuit 103 has a memory for storing signals for each column, and so forth.

FIG. 2 is a diagram illustrating a simple configuration of each unit pixel 201 that constitutes the pixel array 101 according to the embodiment. The unit pixel 201 includes a microlens 202, two photoelectric conversion portions, or photodiodes (PD) 203 and 204, provided for the microlens 202, transfer switches 205 and 206 for transferring signals of the PD 203 and 204, respectively, and a floating diffusion portion (FD) 207 for temporarily storing the signals of the PDs 203 and 204. The unit pixel 201 also includes a plurality of constituent elements, which will be explained later, in addition to the constituent elements shown in FIG. 2. The PDs 203 and 204 receive bundles of light that have passed through different pupil regions of an imaging lens (not shown) via the microlens 202, and accumulate charge corresponding to the quantities of incident light. Accordingly, by comparing a pair of signals having a parallax respectively obtained from the PDs 203 and 204, it is possible to detect a focus state of the imaging lens using a known phase difference detection method. Further, by adding the signals from the PDs 203 and 204 for each unit pixel, it is possible to obtain a normal image signal (added signal) for constituting a normal image. Thus, the pixels of the present invention can be used for both phase difference detection and image shooting.

FIG. 3 is a diagram illustrating an example of part of pixels that constitute the pixel array 101 and wiring layout of driving signal lines for driving the pixel array 101 according to the embodiment. Note that, in FIG. 3, pixel arrangement of four rows and 2 columns of unit pixels 301 to 308 are shown, however, the pixel array 101 has actually a large number of unit pixels for providing a two-dimensional image. Further, each of the unit pixels 301 to 308 has the same configuration as the unit pixel 201 shown in FIG. 2.

In FIG. 3, the unit pixels 301 to 308 are arranged in H to H+1 columns and V to V+3 rows. The pixel array 101 is covered by a Bayer color filter, and among unit pixels 301 to 308, G filters that mainly allow green (G) light to pass through are provided over the unit pixels 301, 303, 306 and 308. Further, B filters that mainly allow blue (B) light to pass through are provided over the unit pixels 302 and 304, and R filters that mainly allow red (R) light to pass through are provided over the unit pixels 305 and 307. By thus arranging color filters that mainly pass light of different wavelengths in period of two rows and two columns, it is possible to obtain a color image.

Further, as shown in FIG. 3, control signal lines for driving each unit pixel are arranged by units of two rows, and readout is performed by units of two rows. A wiring 309 is for connecting the FDs 207 of the vertically adjoining unit pixels of the two rows.

The unit pixels 301 and 306 that are covered with the G filters are driven by transfer pulses $\phi TX1(n)$ and $\phi TX2(n)$, and the unit pixels 303 and 308 that are also covered with the G filters are driven by transfer pulses $\phi TX1(n+1)$ and $\phi TX2(n+1)$. Further, the unit pixel 302 that is covered with the B filter and the unit pixel 305 that is covered with the R filter are driven by transfer pulses $\phi TX3(n)$ and $\phi TX4(n)$. Similarly, the unit pixel 304 that is covered with the B filter and the unit pixel 307 that is covered with the R filter are driven by transfer pulses $\phi TX3(n+1)$ and $\phi TX4(n+1)$. Control signal lines for providing the respective transfer pulses ϕTX are respectively connected to PDs that are at the relatively same positions in each unit pixel.

As described above, the transfer pulses ϕTX1 and ϕTX2 control transference of signal charges of the unit pixels covered with the G filters, and the transfer pulses ϕTX3 and ϕTX4 control transference of signal charges of the unit pixels covered with the R and B filters. Details of the driving will be explained later with reference to FIGS. 6A and 6B.

Figure 4:
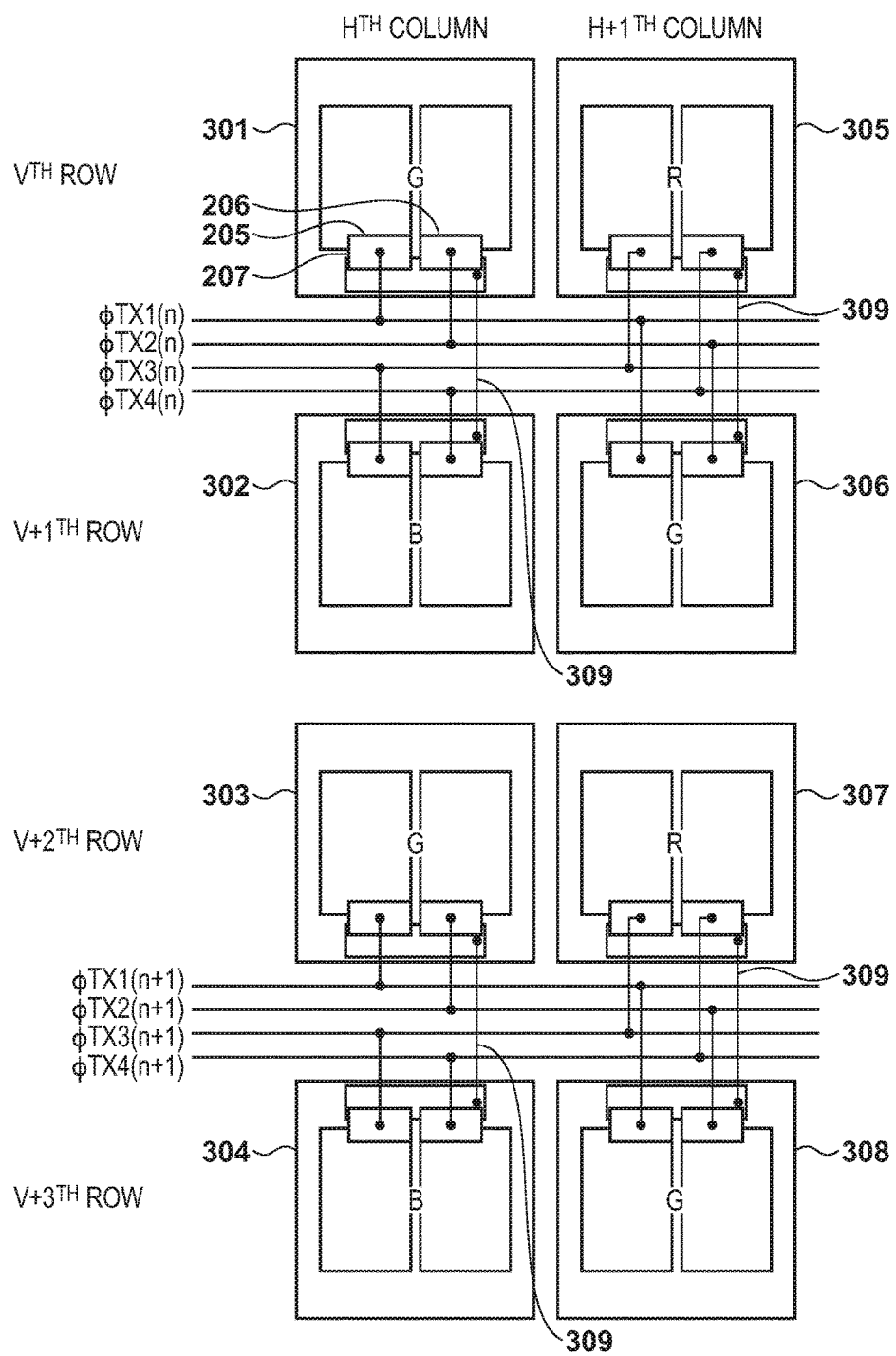
FIG. 4 is a diagram illustrating another example of part of pixels and wiring layout according to the embodiment.

FIG. 4 shows another example illustrating part of pixels that constitute the pixel array 101 and wiring layout of driving signal lines for driving the pixel array 101 according to the embodiment. FIG. 4 differs from FIG. 3 in that the transfer switches 205 and 206 and the FDs 207 of the unit pixels in the Vth row and V+1th row, and those in the V+2th row and V+3th row face each other. Further, in FIG. 3, the control signal lines for providing the transfer pulses ϕTX1 and ϕTX2 and the control signal lines for providing the transfer pulses ϕTX3 and ϕTX4 are arranged between different pixel rows. By contrast, in FIG. 4, the control signal lines for providing the transfer pulses ϕTX1, ϕTX2, ϕTX3 and ϕTX4 are arranged between the same pixel rows. By arranging the control signal lines for the transfer pulses ϕTX1(n), ϕTX2(n), ϕTX3(n) and ϕTX4(n) in an area between facing FDs 207, it is possible to shorten the length of connecting lines between the control signal lines and the respective transfer switches. The same is applied to the V+2th rows and V+3th rows, and the transfer pulses ϕTX1(n+1), ϕTX2(n+1), ϕTX3(n+1) and ϕTX4(n+1), and the same structure is repeated by units of two rows.

Such control signal lines are usually formed by a metal film, such as an aluminum film, while avoiding the PDs. However, since the control signal lines physically have areas, wiring of the control signal lines sometimes affects opening ratios of the PDs. Therefore, a layout that can reduce the areas of the control signal lines, such as to reduce the lengths of the control signal lines, is effective to some extent for increasing the opening ratios of the PDs and consequently for increasing sensitivity of the PD.

Figure 5:
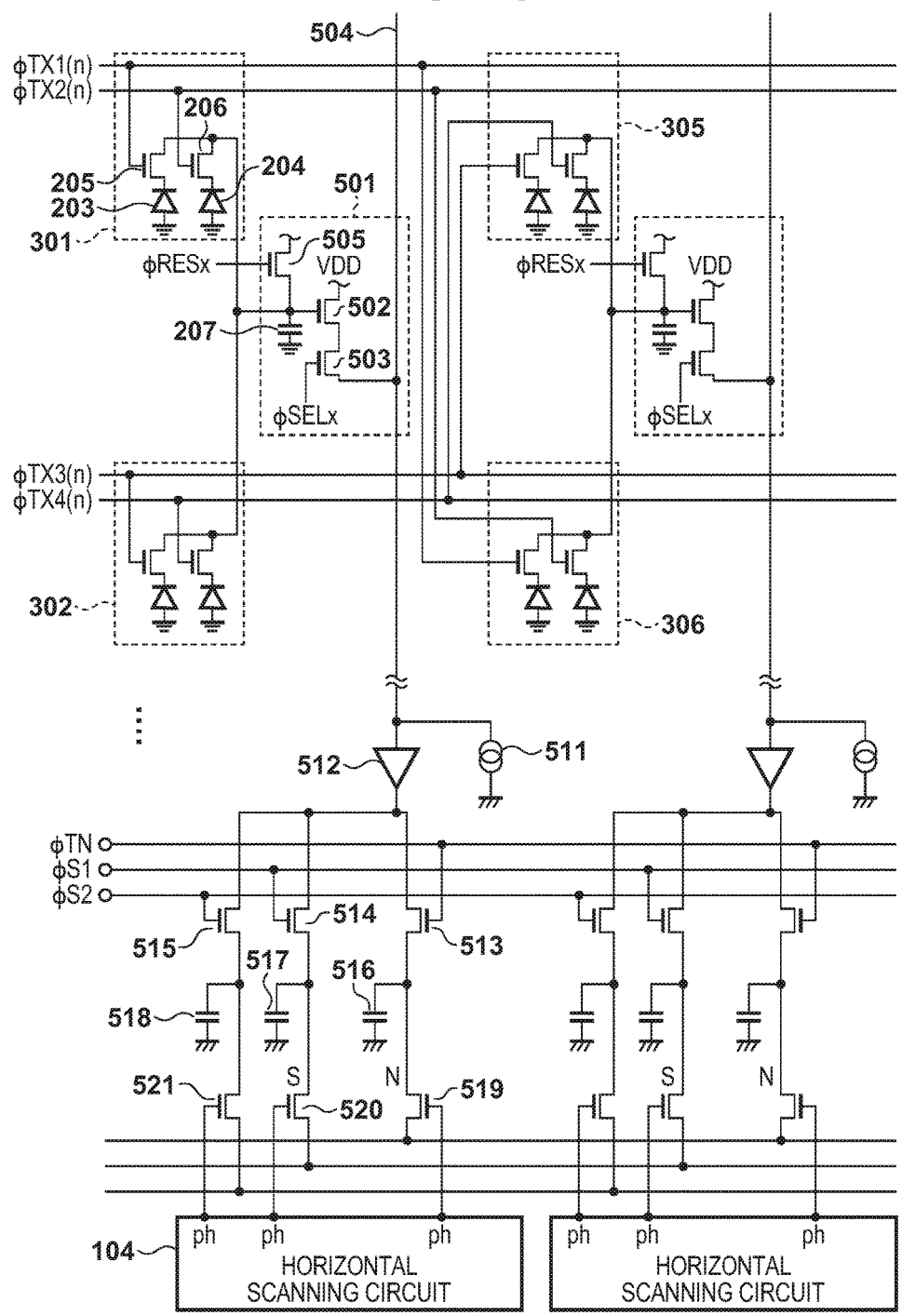
FIG. 5 is an equivalent circuit diagram for showing a circuit configuration of a pixel according to the embodiment.

FIG. 5 is an equivalent circuit diagram showing circuit configuration of control signal lines and the unit pixels 301, 302, 305 and 306 among the unit pixels shown in FIG. 3. Circuitries 501 are for reading out signals and are shared by the unit pixels 301 and 302, and unit pixels 305 and 306. Each circuitry 501 has the FD 207 that functions as a buffer for temporarily storing charge, a MOS amplifier 502 that functions as a source follower, a selection switch 503 for selecting unit pixels in response to a selection pulse ϕSELx, and a reset switch 505 for resetting the FD 207 by potential VDD in response to a reset pulse ϕRESx. By sharing the circuitry 501 for readout by two unit pixels, the number of circuitries in a unit pixel is reduced, which contributes to an increase in the opening ratio and the areas of PDs 203 and 204, and a dynamic range.

The transfer switches 205 and 206 of the unit pixels 301 and 306 are driven by the transfer pulses ϕTX1(n) and ϕTX2(n), respectively. The transfer switches 205 and 206 of the unit pixels 302 and 305 are driven by the transfer pulses ϕTX3(n) and ϕTX4(n), respectively. Then, light charge generated in the respective PDs 203 and 204 are transferred to the FD 207. A floating diffusion amplifier is formed with the FD 207, the MOS amplifier 502 and a fixed current source 511, and a voltage signal of the FD 207 of the unit pixel selected by the selection switch 503 is output to a column output line 504, and read out to the readout circuit 103. Note that "n" of the transfer pulses ϕTX1(n), ϕTX2(n), ϕTX3(n), ϕTX4(n) and the appended "x" of the selection pulse ϕSELx and the reset pulse ϕRESx indicate the driving order from the first. The pulses are driven sequentially until signals are read out from all of the pixels.

The signal output to the column output line 504 is input to the readout circuit 103, and amplified by an amplifier 512. At this time, an output (noise signal) of a unit pixel that is read out immediately after releasing a reset state as described later is stored in a capacitor 516 via a MOS switch 513 which is controlled by a pulse ϕTN. Signals read out from the PDs are stored in capacitors 517 and 518 via MOS switches 514 and 515 which are controlled by pulses ϕS1 and ϕS2, respectively. The signals read out to the capacitors 516, 517 and 518 of the readout circuit 103 as described above are selected by column by a ph signal controlled by the horizontal scanning circuit 104, and a signal from which a noise signal is subtracted by a differential output circuit (not shown) is output.

Note that the readout circuit 103 may have AD converters in addition to the above described structure.

Figure 6A:
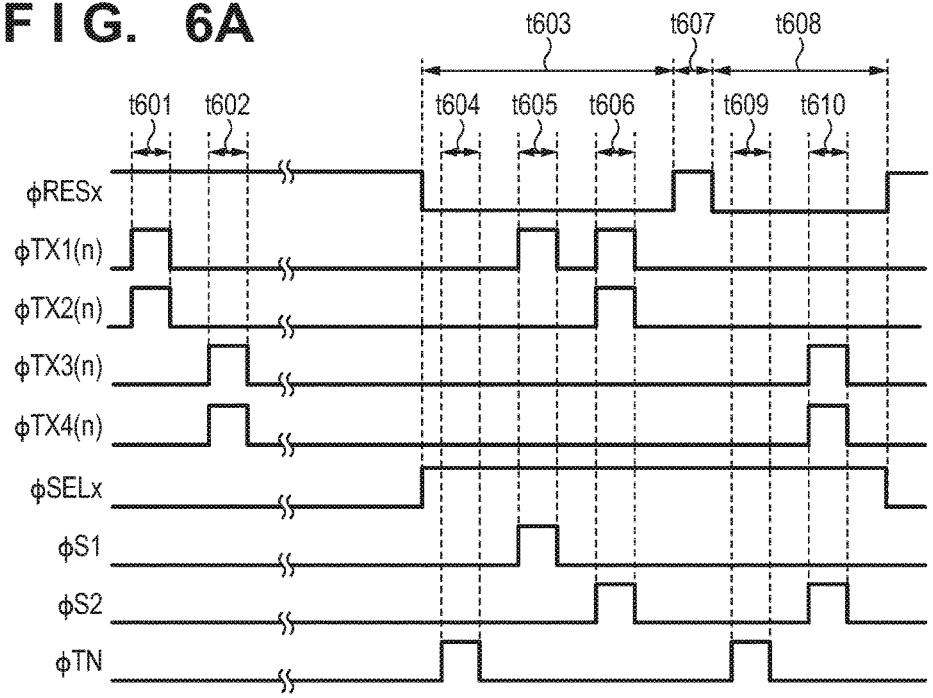
FIGS. 6A and 6B are timing charts showing driving patterns of an image sensor according to the embodiment.
Figure 6B:
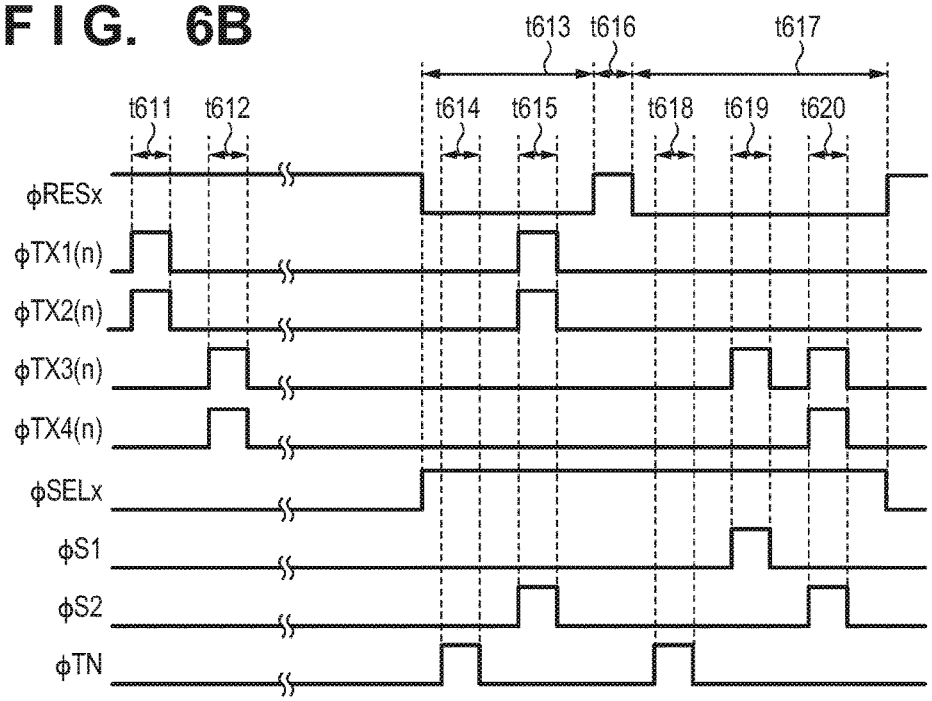

Next, a driving method of the image sensor 100 having the above configuration is explained. FIGS. 6A and 6B are timing charts showing a driving pattern of the image sensor 100 according to this embodiment. FIG. 6A shows a driving method in which divided readout is performed for the unit pixels covered with G filters so as to be capable of separately obtaining signals from the PDs 203 and 204, and in which added readout is performed for the unit pixels covered with R and B filters so that added signals of the PDs 203 and 204 are obtained. On the other hand, FIG. 6B shows a driving method in which the added readout is performed on the unit pixels covered with G filters, and the divided readout is performed on the unit pixels covered with R and B filters.

First, the driving method is explained with reference to FIG. 6A. During a period t601, the reset pulse ϕRESx and the transfer pulses ϕTX1(n) and ϕTX2(n) are simultaneously made to high potential (H level), and the reset switches 505 and the transfer switches 205 and 206 of the unit pixels covered with G filters in the Vth and V+1th rows are turned on, thereby resetting the potential of the PDs 203 and 204, and FD 207 to an initial potential of the potential VDD. Thereafter, when the transfer pulses ϕTX1(n) and ϕTX2(n) becomes low potential (L level), charge accumulation starts in the PDs 203 and 204 of the unit pixels in the Vth and V+1th rows covered with G filters. Similarly, during a period t602, the reset pulse ϕRESx and the transfer pulses ϕTX3(n) and ϕTX4(n) are simultaneously made to H level, and the reset switches 505 and the transfer switches 205 and 206 of the unit pixels covered with R and B filters in the Vth and V+1th rows are turned on, thereby resetting the potential of the PDs 203 and 204, and FDs 207 to an initial potential of the potential VDD. Thereafter, when the transfer pulses ϕTX3(n) and ϕTX4(n) becomes L level, charge accumulation starts in the PDs 203 and 204 of the unit pixels in the Vth and V+1th rows covered with R and B filters. As signals from the unit pixels covered with G filters and signals from the unit pixels covered with R and B filters are read out at different timings, it is necessary to shift the reset timings as described above in order to make the charge accumulation periods equal.

After a charge accumulation period that is predetermined by photometry has passed, the selection pulse ϕSELx is turned to H level to turn on the selection switches 503 during a period t603, thereby selecting rows from which signals are to be read out. From among the unit pixels in the selected two rows, signals are read out from the unit pixels covered with G filters. At the same time, the reset pulse ϕRESx is turned to L level to end resetting of the FDs 207.

During a period t604 of the period t603, a φTN pulse is turned to H level to turn on the MOS switches 513, and N signals which are reset signals of the FDs 207 are held in the capacitors 516. Next, during a period t605, the transfer pulse φTX1(n) and the pulse φS1 are simultaneously turned to H level to turn on the transfer switches 205 of the unit pixels 301 and 306 and the MOS switches 514. By doing so, first PD signals, each of which is a combined signal of a light signal of the PD 203 of each of the unit pixels 301 and 306 and N signal, are held in the capacitors 517. Next, during a period t606, without turning on the reset switches 505, the transfer pulses φTX1(n) and φTX2(n) and pulse φS2 are simultaneously turned to H level to turn on the transfer switches 205 and 206 of the unit pixels 301 and 306, and the MOS switches 515. By doing so, second PD signals, each of which is a combined signal of the light signals of the PD 203 and the light signal of the PD 204 of each of the unit pixels 301 and 306, and N signal, are stored in the capacitors 518. Note that, since the signals of the PDs 203 have been read out to the FDs 207 by turning on the transfer pulse φTX1(n) during the period t605, the transfer pulse φTX1(n) may be kept L level during the period t606. Strictly speaking, a charge accumulation period starts at the end of the period t601 and ends at the end of the period t606.

Thereafter, the capacitors 516 to 518 are sequentially selected column by column by the ph signal which is controlled by the horizontal scanning circuit 104, and an A image signal obtained by subtracting the N signals from the first PD signals and a normal image signal obtained by subtracting the N signals from the second PD signals are output to outside of the image sensor 100. Since the normal image signal is a combined signal of the signals from the PDs 203 and the signals from the PDs 204, by subtracting the A image signal from the normal image signal, a B image signal, that is a signal from PDs 204, is generated. Thus the obtained A image signal and B image signal can be used for phase difference detection. As described above, it is possible to obtain the A image signal and the B image signal for phase difference detection, and the normal image signal from the unit pixels covered with G filters.

Next during a period t607, from among the unit pixels in the selected two rows, the reset switches 505 are turned on by turning on the reset pulse φRESx to reset the FDs 207 in preparation for reading out signals from the unit pixels covered with R and B filters. Next during a period t608, from among the unit pixels in the selected two rows, signals are read out from the unit pixels covered with R and B filters. At the same time, the reset pulse φRESx is turned to L level to end resetting of the FDs 207.

During a period t609 in the period t608, the pulse φTN is turned to H level to turn on the MOS switches 513, thereby the N signals, which are reset signals of the FDs 207, are held in the capacitors 516. Next, during a period t610, the transfer pulses φTX3(n) and φTX4(n) and the pulse φS2 are simultaneously turned to H level to turn on the transfer switches 205 and 206 of the unit pixels 302 and 305 and the MOS switches 515. By doing so, the second PD signals, each of which is a combined signal of the light signals of the PDs 203 and PD 204 for each of the unit pixels 302 and 305 and N signal, are held in the capacitor t518.

With the operation described as above, a normal signal obtained by subtracting the N signals from the second PD signals in accordance with the ph signal controlled by the horizontal scanning circuit 104 is output to outside of the image sensor 100.

The driving control as described above with reference to FIG. 6A is referred to as "first driving mode", hereinafter.

Next, a driving method is explained with reference to FIG. 6B. During a period t611, similarly to the period t601, the reset pulse φRESx and the transfer pulses φTX1(n) and φTX2(n) are simultaneously made to H level, and the PDs 203 and 204 of the unit pixels covered with G filters, and FDs 207 in the Vth and V+1th rows are reset. Further, during a period t612, similarly to the period t602, the reset pulse φRESx and the transfer pulses φTX3(n) and φTX4(n) are simultaneously made to H level, and the PDs 203 and 204 of the unit pixels covered with R and B filters and FDs 207 in the Vth and V+1th rows are reset.

After a charge accumulation period that is predetermined by photometry has passed, the selection pulse φSELx is turned to H level to turn on the selection switches 503 during a period t613, thereby selecting rows from which signals are to be read out. From among the unit pixels in the selected two rows, signals are read out from the unit pixels covered with G filters. At the same time, the reset pulse φRESx is turned to L level to end resetting of the FD 207.s During a period t614 in the period t613, a φTN pulse is turned to H level to turn on the MOS switches 513, and N signals which are reset signals of the FDs 207 are held in the capacitors 516. Next, during a period t615, the transfer pulses φTX1(n) and φTX2(n) and the pulse φS2 are simultaneously turned to H level to turn on the transfer switches 205 and 206 of the unit pixels 301 and 306 and the MOS switch 514. By doing so, second PD signals, each of which is a combined signal of a light signals of the PDs 203 and 204 of each of the unit pixels 301 and 306 and N signal, are held in the capacitors 518.

A normal signal obtained by subtracting the N signals from the second PD signals, read out to the readout circuit 103 with the operation described as above, is output to outside of the image sensor 100 in accordance with the ph signal controlled by the horizontal scanning circuit 104.

Next during a period t616, from among the unit pixels in the selected two rows, the reset switches 505 are turned on by turning the reset pulse φRESx to H level to reset the FDs 207 in preparation for reading out signals from the unit pixels covered with R and B filters. Next, during a period t617, from among the unit pixels in the selected two rows, signals are read out from the unit pixels covered with R and B filters. At the same time, the reset pulse φRESx is turned to L level to end resetting of the FDs 207.

During a period t618 in the period t617, the pulse φTN is turned to H level to turn on the MOS switches 513, thereby N signals, which is reset signals of the FDs 207, are held in the capacitors 516. Next, during a period t619, the transfer pulse φTX1(n) and the pulse φS1 are simultaneously turned to H level to turn on the transfer switches 205 of the unit pixels 302 and 305 and the MOS switches 514. By doing so, the first PD signals, each of which is a combined signal of the light signal of the PD 203 of each of the unit pixels 302 and 305 and N signal, are held in the capacitors t517. Next, during a period t620, without turning on the reset switches 505, the transfer pulses φTX1(n) and φTX2(n) and the pulse φS2 are simultaneously turned to H level to turn on the transfer switches 205 and 206 of the unit pixels 302 and 305 and the MOS switches 515. By doing so, second PD signals, each of which is a combined signal of the light signal of the PD 203, the light signal of the PD 204, and N signal for each of the unit pixels 302 and 305, are stored in the capacitors 518. Note that, since the signals of the PDs 203 have been read out to the FDs 207 by turning on the transfer pulse φTX1(n) during the period t619, the transfer pulse φTX1(n) may be kept L level during the period t620. Strictly speaking, a charge accumulation period starts at the end of the period t612 and ends at the end of the period t620.

Thereafter, the capacitors 516 to 518 are sequentially selected column by column by the ph signal which is controlled by the horizontal scanning circuit 104, and an A image signal obtained by subtracting the N signals from the first PD signals and a normal image signal obtained by subtracting the N signal from the second PD signals is output to outside of the image sensor 100. Since the normal image signal is a combined signal of the signals of PDs 203 and the signals of PDs 204, by subtracting the A image signal from the normal image signal, a B image signal, that is a signal of PDs 204, is generated. The A image signal and the B image signal can be used for phase difference detection. As described above, it is possible to obtain the A image signal and the B image signal for phase difference detection, and the normal image signal from the unit pixels covered with R and B filters.

The driving control as described above with reference to FIG. 6B is referred to as "second driving mode", hereinafter.

As described above, between a group of control signal lines for providing the transfer pulses φTX1 and φTX2, and a group of control signal lines for providing the transfer pulses φTX3 and φTX4, one of the two groups of the control signal lines is driven so as to perform the divided readout, and the other group is driven so as to perform the added readout. In this manner, for the unit pixels from which only the normal image signal is needed, a period for reading out the first PD signals for phase difference detection becomes unneeded, thereby it is possible to increase the readout speed for reading out signals from the unit pixels from which only the normal image signal is to be read out.

Further, with the above simple control of driving timing, it is possible to control whether to read out signals for phase difference detection or a normal image signal, independently for unit pixels covered with G filters and for unit pixels covered with R and B filters.

Note that, as described above, signals output from the image sensor 100 are not output sequentially row by row, but signals of different rows are output every other pixels. Therefore, in order to use the read out signals as the normal image signal, it is necessary to rearrange the order of signals so as to coincide with the order of the pixels inside or outside of the image sensor 100.

Further, in the example described as above, it is explained a case in which two PDs 203 and 204 are provided for each microlens 202, however, the present invention is not limited to this, and three or more PDs may be formed for each microlens 202. In that case, by providing the same number of control signals for providing the transfer pulses φTX as the number of PDs, it is possible to control such image sensor similarly to the above described case where two PDs 203 and 204 are provided for each microlens 202.

Next, a description will be given of a case where the image sensor 100 having the above described structure is applied to a digital camera which is a representative of an image capturing apparatus.

Figure 7:
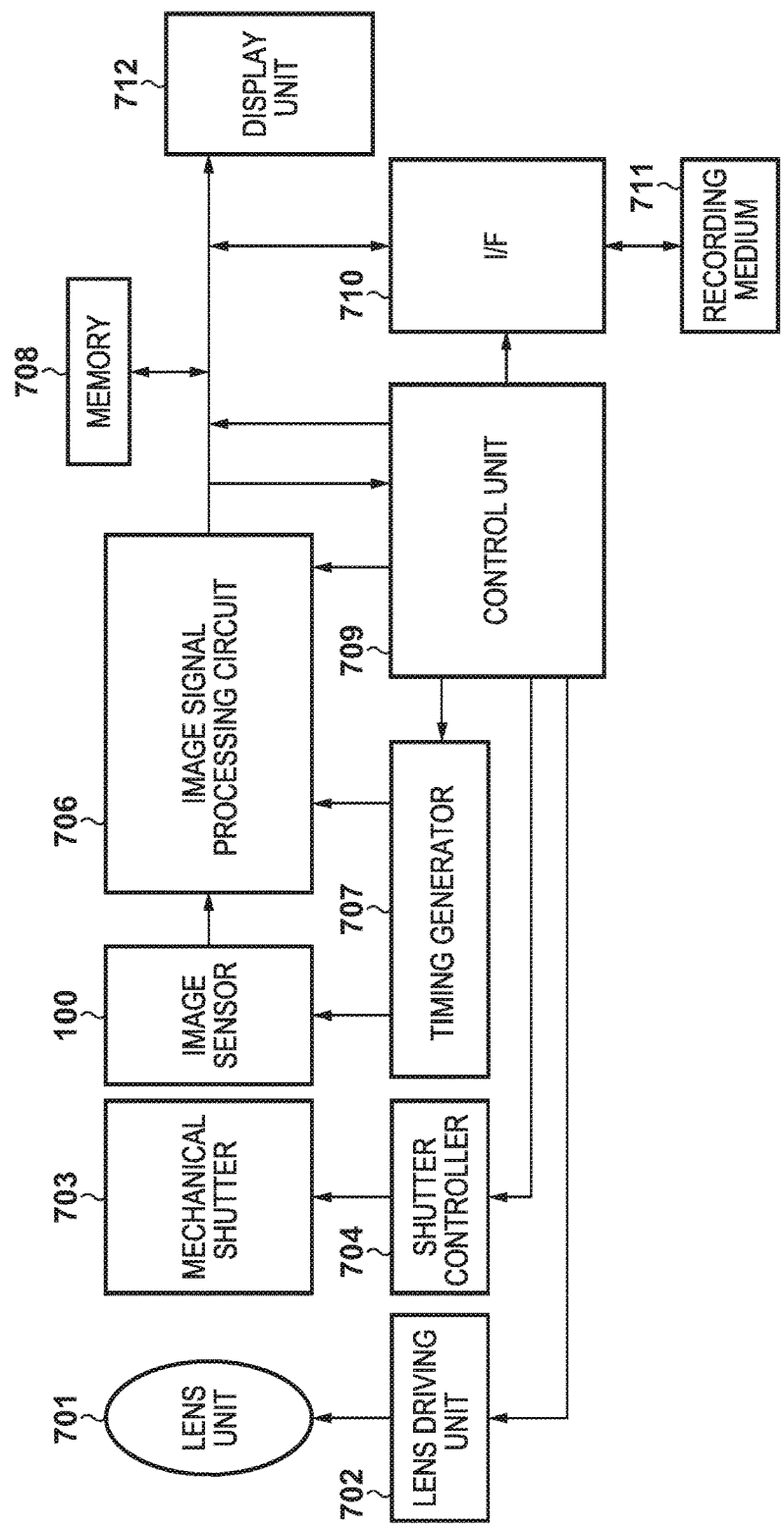
FIG. 7 is a block diagram illustrating a brief configuration of an image capturing apparatus according to the embodiment.

In FIG. 7, a lens unit 701 forms an optical image of a subject on the image sensor 100 and realizes zoom control, focus control and aperture control by a lens driving unit 702. A mechanical shutter 703 is controlled by a shutter controller 704. The image sensor 100 performs photoelectric conversion on the optical image of the subject formed by the lens unit 701, and generates image signals. An image signal processing circuit 706 applies various correction to the image signals output from the image sensor 100, and compresses data. Further, the image signal processing circuit 706 includes a computation circuit for detecting a focus state using signals for phase difference detection obtained from the image sensor 100 as described above.

A timing generator 707 outputs various timing signals to the image sensor 100 and the image signal processing circuit 706, and generates at least two kinds of timing signals corresponding to the first driving mode and the second driving mode shown in FIGS. 6A and 6B, respectively. A control unit 709 performs various calculation and overall control of the image sensing apparatus. Further, the control unit 709 has an function of switching between the two kinds of timing signals for the first driving mode and the second driving mode to be used in accordance with the condition of the subject.

A memory 708 temporarily stores image data. An interface (I/F) 710 performs recording and readout to/from a recording medium 711. The recording medium 711 includes a detachable recording medium such as a semi-conductor memory to and from which image data is recorded and read out. A display unit 712 displays various kinds of information and shot images.

Figure 8:
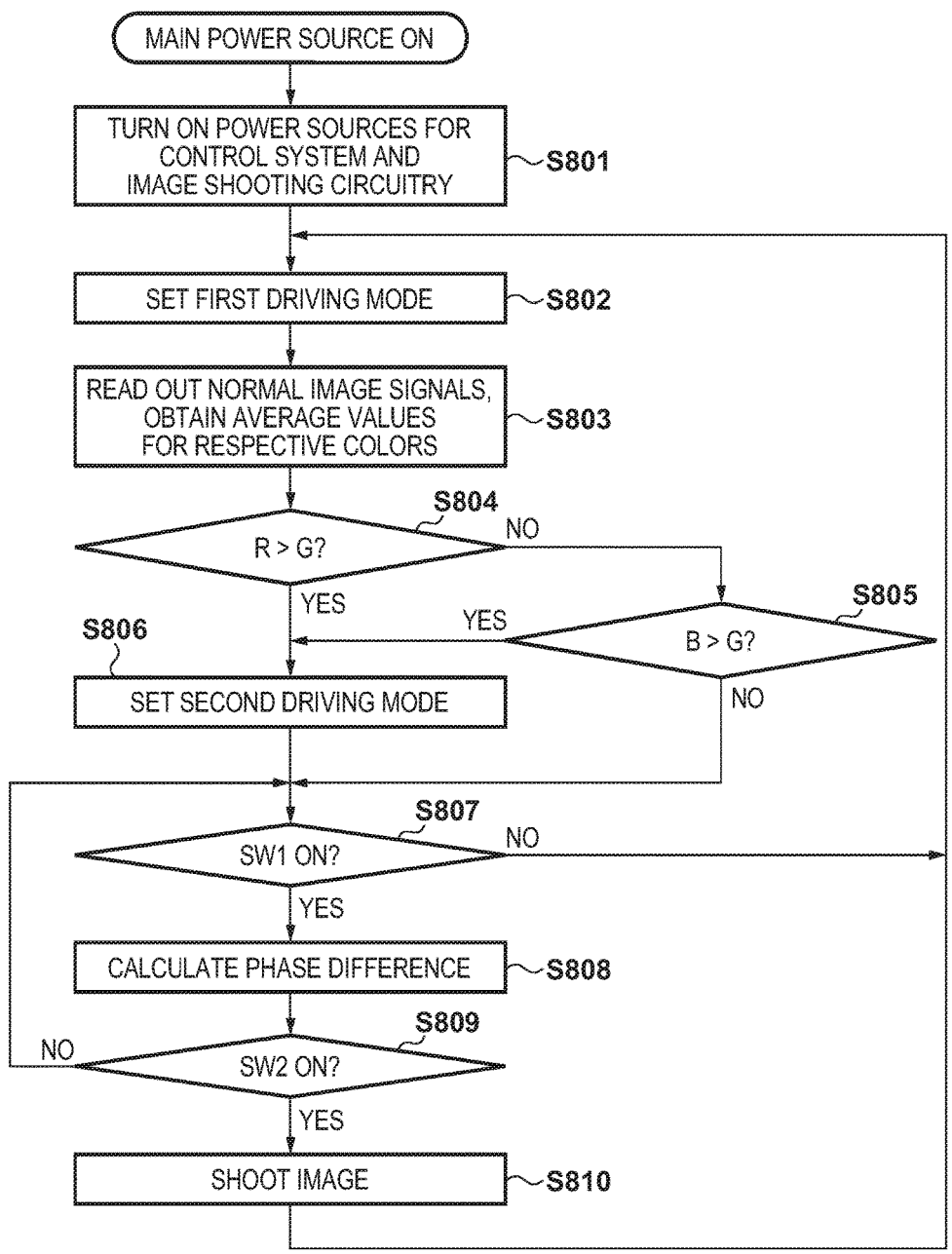
FIG. 8 is a flowchart showing a processing of the image capturing apparatus according to the embodiment.

Next, processing at the time of shooting an image in the digital camera having the above structure is explained. FIG. 8 is a flowchart showing processing since a power is turned on until an image is shot.

When a main power is turned on, a power source for constituents of a control system is turned on, then a power source for an image shooting circuitry such as the image signal processing circuit 706 is turned on (step S801). Then, the control unit 709 first sets the first driving mode as described above with reference to FIG. 6A to the timing generator 707 (step S802). The first driving mode is a mode for reading out phase difference detection signals from the unit pixels covered with G filters.

Next, a color of the subject is analyzed. More specifically, first, the image sensor 100 is driven in the first driving mode, and an average value R, an average value G and an average value B of the normal image signals read out from the unit pixels covered with R, G and B filters, respectively, are obtained (step S803). Then, the average value R and the average value G are compared to determine which of the two is greater (step S804). If it is determined that the average value R is greater, then the process proceeds to step S806, where the second driving mode that is explained with reference to FIG. 6B is set. In the second driving mode, phase difference detection signals are read out from the unit pixels covered with R and B filters. On the other hand, if it is determined that the average value R is equal to or less than the average value G in step S804, then the process proceeds to step S805, where the average value B and the average value G are compared to determine which of the two is greater. If it is determined that the average value B is greater, then the process proceeds to step S806, and the second driving mode is set. On the other hand, if it is determined that the average value B is equal to or less than the average value G, then the process proceeds to step S807 with keeping the first driving mode.

In step S807, whether or not image shooting preparation is instructed by pressing a release button (not shown) halfway (SW1 ON) is determined. If the release button is not pressed halfway, the process returns to step S802 and the above described processes are repeated. If the release button is pressed halfway, a phase difference is calculated based on the A image signal and the B image signal obtained from the image sensor 100 in the set driving mode (step S808). At this time, the signal used for phase difference calculation is phase difference detection signals obtained from the unit pixels covered with G filters as set in step S802 or phase difference detection signals obtained from the unit pixels covered with R and B filters as set in step S806. Accordingly, it is possible to perform phase difference detection suitable for the color of a subject. Further, color component which constitutes the subject less is read out as a normal image signal, higher speed readout operation becomes possible comparing to a case of reading out phase difference detection signals from all the pixels.

Thereafter, whether or not image shooting is instructed by full-stroke (SW2 ON) of the release button is determined (step S809). If not, the process returns to step S807, and above described processes are repeated. If the release button is fully pressed, then the processing proceeds to step S810 and image shooting operation is performed, then returns to step S802.

Although it is not shown, after the image shooting is finished, image signals output from the image sensor 100 undergo image processing by the image signal processing circuit 706, and written to the memory 708 under the control of the control unit 709. In the image signal processing circuit 706, rearrangement processing, addition processing and selection processing for the addition processing are performed. The data stored in the memory 708 is recorded on the detachable recording medium 711, such as a semiconductor memory, via the I/F 710 under control of the control unit 709. Further, the image signals may be directly input to a computer or the like via an external I/F (not shown), and processed there.

Further, in step S803, the average values R, G, and B may be simple averages of the signals from the entire frame, or may be weighted averages obtained by weighting more on signals from a center portion of the frame. Further, a unit for determining a main subject is further provided, and weighted averages may be calculated by weighting more on signals from an area of the frame where the main subject exists. Further, average values obtained during auto white balance correction may be used instead of the exclusively calculated average values for color determination. Furthermore, a correction result of the auto white balance correction may be taken into consideration upon performing the comparison in steps S804 and S805.

According to the embodiment as described above, phase difference detection suitable for color of a subject as well as high speed read out become possible compared to a case where phase difference detection signals are read out from all the pixels, since a color component which is less included in a subject is read out as a normal image signal.

Modification

Figure 9:
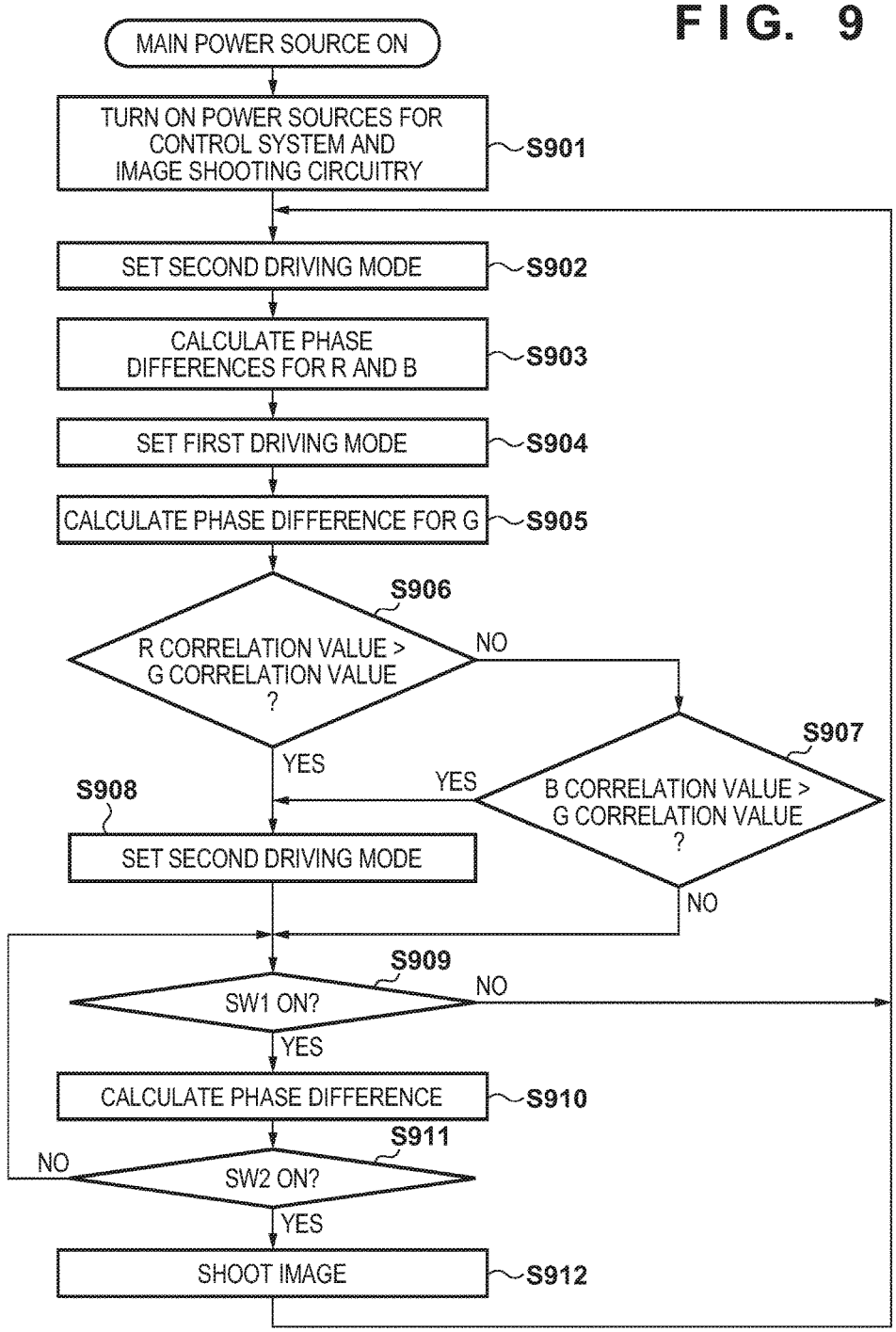
FIG. 9 is a flowchart showing a processing of the image capturing apparatus according to a modification of the embodiment.

FIG. 9 is a flowchart showing another processing until an image shooting is performed. The processing until the start of image shooting will be explained below with reference to FIG. 9.

When a main power is turned on, a power source for constituents of a control system is turned on, then a power source for an image shooting circuitry such as the image signal processing circuit 706 is turned on (step S901). Then, the control unit 709 first sets the second driving mode to the timing generator 707 (step S902).

Next in step S903, known phase difference calculation is performed based on the A image signals and the B image signals obtained from the unit pixels covered with R and B filters, and obtains correlation value. More specifically, in the following equation Correlation Value $(k)=\Sigma|A(H)B(H+k)-A(H)B(H)|$ a maximum correlation value (k)=correlation value (kmax) is obtained, and stores an R correlation value (kmax) and B correlation value (kmax) are recorded.

Next in step S904, the first driving mode is set to the timing generator 707, and, similarly to the R signal and B signal, G correlation value (kmax) is calculated based on the A image signal and the B image signal of the unit pixels covered with G filters in step S905, and recorded.

Thereafter, in step S906, it is determined which of the R correlation value (kmax) and the G correlation value (kmax) is greater. If it is determined that the R correlation value (kmax) is greater, then the process proceeds to step S908 where the second driving mode is set. By contrast, if it is determined that the R correlation value (kmax) is equals to or less than the G correlation value (kmax) in step S906, then the process proceeds to step S907, whether which of the B correlation value (kmax) and the G correlation value (kmax) is greater is determined. If it is determined that the B correlation value (kmax) is greater, then the process proceeds to step S908 where the second driving mode is set. By contrast, if it is determined that the B correlation value (kmax) is equals to or less than the G correlation value (kmax), then the process proceeds to step S909 while remaining in the first driving mode.

In step S909, whether or not image shooting preparation is instructed by pressing a release button (not shown) halfway (SW1 ON) is determined. If the release button is not pressed halfway, the process returns to step S902 and the above described processes are repeated. If the release button is pressed halfway, a phase difference is calculated based on the A image signal and the B image signal obtained from the image sensor 100 in the set driving mode (step S910). At this time, the signal used for phase difference calculation is phase difference detection signals obtained from the unit pixels covered with G filters as set in step S904 or phase difference detection signals obtained from the unit pixels covered with R and B filters set in step S908. Accordingly, it is possible to perform phase difference detection suitable for color of a subject. Further, a color component which constitutes the subject less is read out as a normal image signal, so higher speed readout operation becomes possible compared to a case of reading out phase difference detection signals from all the pixels.

Thereafter, whether or not image shooting is instructed by full-stroke (SW2 ON) of the release button is determined (step S911). If not, the process returns to step S909, and above described processes are repeated. If the release button is fully pressed, then the processing proceeds to step S912 and image shooting operation is performed, then returns to step S902.

In the processing shown in FIG. 9, control is performed such that, by comparing correlation values of the phase difference detection operation for G, R and B when the image shooting system is powered on, color signals with high correlation value are read out as phase difference detection signals. In this manner, while performing phase difference detection suitable for color of a subject, it is possible to increase readout speed for phase difference detection at the time when the release button is pressed.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-140058, filed on Jul. 13, 2015 which is hereby incorporated by reference herein in its entirety.

What is claimed is:

1. An image sensor comprising:
    a plurality of unit pixels, arranged in matrix, each having a plurality of photoelectric conversion portions for accumulating charge corresponding to a quantity of incident light and outputting signals, having parallax information, corresponding to the accumulated charge;
    color filters, arranged for the plurality of unit pixels, respectively, that mainly pass light of wavelengths corresponding to different colors;
    first control signal lines corresponding to every predetermined number of rows and connected to the unit pixels corresponding to the color filters of a first color to control an output timing of the signals from the respective photoelectric conversion portions, the unit pixels being included in the predetermined number of rows; and
    second control signal lines corresponding to the every predetermined number of rows and connected to the unit pixels corresponding to the color filters of a second color to control an output timing of the signals from the respective photoelectric conversion portions, the unit pixels being included in the same predetermined number of rows that include the unit pixels corresponding to the color filters of the first color,
    wherein in a case that the predetermined number of rows is greater than one, the first and second control signal lines are arranged between the every predetermined number of rows.

2. The image sensor according to claim 1, wherein each of the plurality of unit pixels has a microlens.

3. The image sensor according to claim 1, wherein the first control signal lines and the second control signal lines are arranged between different rows from each other.

4. The image sensor according to claim 1, wherein the first control signal lines and the second control signal lines are arranged between same rows of the unit pixels.

5. The image sensor according to claim 1, wherein the first control signal lines and the second control signal lines respectively include a same number of control signal lines as a number of the photoelectric conversion portions included in each unit pixel.

6. The image sensor according to claim 1, wherein the color filters have a Bayer color arrangement, and the first control signal lines are connected to the unit pixels corresponding to green color filters, and the second control signal lines are connected to the unit pixels corresponding to red and blue color filters.

7. An image capturing apparatus, comprising:
    an image sensor having:
        a plurality of unit pixels, arranged in matrix, each having a plurality of photoelectric conversion portions for accumulating charge corresponding to a quantity of incident light;
        color filters, arranged for the plurality of unit pixels, respectively, that mainly pass light of wavelengths corresponding to different colors;
        first control signal lines corresponding to every predetermined number of rows and connected to the unit pixels corresponding to the color filters of a first color, the unit pixels being included in the predetermined number of rows; and
        second control signal lines corresponding to the every predetermined number of rows and connected to the unit pixels corresponding to the color filters of a second color, the unit pixels being included in the same predetermined number of rows that include the unit pixels corresponding to the color filters of the first color; and
    a control unit configured to control to drive one of the first control signal lines and the second control signal lines by a divided readout method and drive the other of the first control signal lines and the second control signal lines by an added readout method on a basis of a result of analyzing image signals obtained from the image sensor,
    wherein the divided readout method obtains a pair of signals having parallax information and an added signal from the charge accumulated in the plurality of photoelectric conversion portions of each unit pixel, and the added readout method obtains an added signal without obtaining a pair of signals having parallax information from the charge accumulated in the plurality of photoelectric conversion portions of each unit pixel, and
    wherein in a case that the predetermined number of rows is greater than one, the first and second control signal lines are arranged between the every predetermined number of rows.

8. The image capturing apparatus according to claim 7, further comprising a calculation unit configured to obtain average values of the image signals respectively for the plurality of colors obtained from the image sensor,
    wherein the control unit controls to drive, by the divided readout method, the one of the first control signal lines or the second control signal lines connected to the unit pixels corresponding to the color filters of a color that corresponds to a largest of the average values among the plurality of colors.

9. The image capturing apparatus according to claim 7, further comprising a calculation unit configured to obtain correlation values respectively for the plurality of colors based on the image signals obtained from the image sensor, wherein the control unit controls to drive, by the divided readout method, the one of the first control signal lines or the second control signal lines connected to the unit pixels corresponding to the color filters of a color that corresponds to a largest of the correlation values among the plurality of colors.

10. A driving method for an image sensor that has a plurality of unit pixels, arranged in matrix, each having a plurality of photoelectric conversion portions for accumulating charge corresponding to a quantity of incident light, color filters, arranged for the plurality of unit pixels, respectively, that mainly pass light of wavelengths corresponding to different colors, first control signal lines corresponding to every predetermined number of rows and connected to the unit pixels corresponding to the color filters of a first color, the unit pixels being included in the predetermined number of rows, and second control signal lines corresponding to the every predetermined number of rows and connected to the unit pixels corresponding to the color filters of a second color, the unit pixels being included in the same predetermined number of rows that include the unit pixels corresponding to the color filters of the first color, wherein in a case that the predetermined number of rows is greater than one, the first and second control signal lines are arranged between the every predetermined number of rows, the method comprising:

determining to drive one of the first control signal lines and the second control signal lines by a divided readout method and drive the other of the first control signal lines and the second control signal lines by an added readout method on a basis of a result of analyzing image signals obtained from the image sensor, wherein the divided readout method obtains a pair of signals having parallax information and an added signal from the charge accumulated in the plurality of photoelectric conversion portions of each unit pixel, and the added readout method obtains an added signal without obtaining a pair of signals having parallax information from the charge accumulated in the plurality of photoelectric conversion portions of each unit pixel; and driving, based on a determination result, one of the first control signal lines and the second control signal lines by the divided readout method and reading out signals from the unit pixels connected to the control signal lines driven by the divided readout method, and driving the other of the first control signal lines and the second control signal lines by the added readout method and reading out signals from the unit pixels connected to the control signal lines driven by the added readout method.

* * * * *